(12) United States Patent
Lu et al.

(10) Patent No.: US 12,653,066 B2
(45) Date of Patent: Jun. 9, 2026

(54) LIGHT-EMITTING DIODE WITH HIGH RELIABILITY

(71) Applicant: Xiamen PVTECH Co., Ltd., Xiamen (CN)

(72) Inventors: Fuxing Lu, Xiamen (CN); Zhirong Lin, Xiamen (CN)

(73) Assignee: Xiamen PVTECH Co., Ltd., Xiamen (CN)

( * ) Notice: Subject to any disclaimer, the term of this patent is extended or adjusted under 35 U.S.C. 154(b) by 592 days.

(21) Appl. No.: 17/956,781

(22) Filed: Sep. 29, 2022

(65) Prior Publication Data

US 2023/0326911 A1     Oct. 12, 2023

(30) Foreign Application Priority Data

Apr. 11, 2022     (CN) .......................... 202210380952.5

(51) Int. Cl.
*H10W 90/00*          (2026.01)
*H10H 20/857*        (2025.01)

(52) U.S. Cl.
CPC .......... *H10W 90/00* (2026.01); *H10H 20/857* (2025.01)

(58) Field of Classification Search
CPC ............ H01L 25/0756; H01L 25/0753; H10H 20/857; H05B 45/40; H05B 45/00; F21K 9/20; F21V 19/0025; F21V 23/00; F21Y 2115/10; H10W 90/00
See application file for complete search history.

(56) References Cited

U.S. PATENT DOCUMENTS

| | | | | |
|---|---|---|---|---|
| 5,187,377 | A | * 2/1993 | Katoh | ..................... H10H 29/14 327/515 |
| 2004/0075399 | A1* | 4/2004 | Hall | .................... H01L 25/0753 257/E25.02 |
| 2008/0171141 | A1* | 7/2008 | Liu | ...................... H01L 25/0753 205/261 |
| 2008/0211416 | A1* | 9/2008 | Negley | ............... H01L 25/0756 257/E33.001 |
| 2008/0284343 | A1 | 11/2008 | Kuo | |

(Continued)

FOREIGN PATENT DOCUMENTS

| | | |
|---|---|---|
| CN | 101308836 A | 11/2008 |
| CN | 101425506 A | 5/2009 |

(Continued)

*Primary Examiner* — Victor A Mandala
(74) *Attorney, Agent, or Firm* — BruceStone LLP; Joseph A. Bruce

(57) ABSTRACT

A light-emitting diode (LED) with high reliability includes a first solder pad, a second solder pad and a plurality of LED dies. The LED dies are connected to each other in parallel and each of the LED dies has a positive electrode and a negative electrode. The positive electrode and the negative electrode of any one of the LED dies are respectively connected to the negative electrode and the positive electrode of the LED die adjacent thereto via two first conductive wires. The positive electrode and the negative electrode of one of the LED dies are respectively connected to the first solder pad and the second solder pad via two second conductive wires. The special parallel connection structure of the LED can achieve high reliability and satisfy the requirements of environmental protection.

10 Claims, 4 Drawing Sheets

(56) References Cited

U.S. PATENT DOCUMENTS

| | | | |
|---|---|---|---|
| 2012/0126255 A1* | 5/2012 | Hussell | H01L 25/0753 |
| | | | 438/34 |
| 2013/0127352 A1* | 5/2013 | Pan | H01L 25/0753 |
| | | | 315/192 |
| 2014/0148879 A1* | 5/2014 | Mersch | A61N 1/0492 |
| | | | 607/90 |
| 2018/0286915 A1* | 10/2018 | Yeon | H10H 29/14 |
| 2023/0296211 A1* | 9/2023 | Jiang | H05B 45/395 |
| | | | 362/217.01 |
| 2025/0172256 A1* | 5/2025 | Jiang | H05B 45/00 |

FOREIGN PATENT DOCUMENTS

| | | | |
|---|---|---|---|
| JP | 10-321915 A | 12/1998 |
| JP | 2011-249411 A | 12/2011 |
| JP | 2014-112721 A | 6/2014 |
| WO | 2010/040245 A1 | 4/2010 |

* cited by examiner

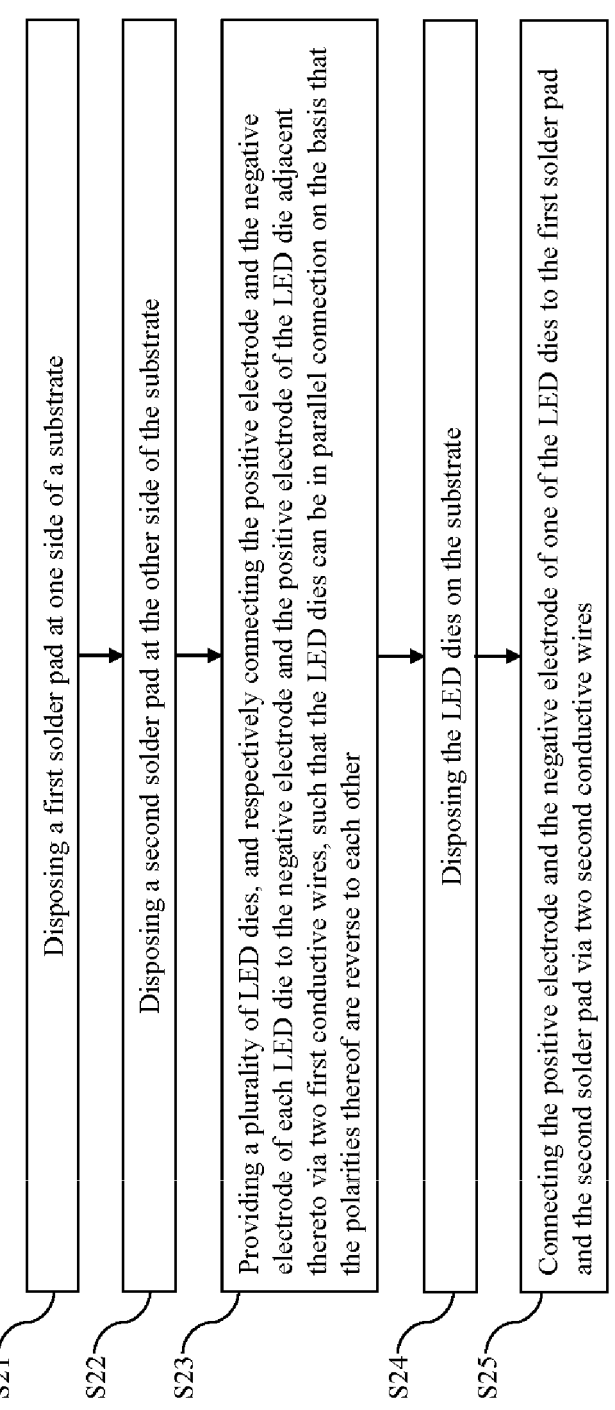

S21 — Disposing a first solder pad at one side of a substrate

S22 — Disposing a second solder pad at the other side of the substrate

S23 — Providing a plurality of LED dies, and respectively connecting the positive electrode and the negative electrode of each LED die to the negative electrode and the positive electrode of the LED die adjacent thereto via two first conductive wires, such that the LED dies can be in parallel connection on the basis that the polarities thereof are reverse to each other S24 — Disposing the LED dies on the substrate S25 — Connecting the positive electrode and the negative electrode of one of the LED dies to the first solder pad and the second solder pad via two second conductive wires

FIG. 2

LIGHT-EMITTING DIODE WITH HIGH RELIABILITY

BACKGROUND OF THE INVENTION

1. Field of the Invention

The present invention relates to a light-emitting diode (LED), in particular to A LED with high reliability.

2. Description of the Prior Art

With advance of technology, light-emitting diode (LED) lighting devices become more and more popular. LED lighting devices have many advantages, such as energy saving, high brightness, low heat generation and more environmentally-friendly. However, when any one of the LEDs of a lighting device malfunctions, the lighting effect of the lighting device obviously deteriorates. Besides, the above situation may cause the overcurrent or open loop of other LEDs not malfunctioning, which may decrease the service lives of the LEDs and influence the user's experience of using the lighting device. Accordingly, it has become an important issue to increase the reliability of the LEDs.

In general, a currently available LED has a plurality of LED dies, and these LED dies are connected to each other in parallel or in series. However, if any one of the LED dies is damaged, the lighting effect of the LED obviously deteriorates. When the above situation occurs, the LED may malfunction and cannot be used again. Thus, the reliability of the currently available LEDs needs to be further enhanced.

SUMMARY OF THE INVENTION

One embodiment of the present invention provides a light-emitting diode (LED) with high reliability, which includes a first solder pad, a second pad and a plurality of LED dies. The LED dies are connected to each other in parallel and each of the LED dies has a positive electrode and a negative electrode. The positive electrode and the negative electrode of any one of the LED dies are respectively connected to the negative electrode and the positive electrode of the LED die adjacent thereto via two first conductive wires. The positive electrode and the negative electrode of one of the LED dies are respectively connected to the first solder pad and the second solder pad via two second conductive wires.

In one embodiment, the LED further includes a substrate and the LED dies are disposed on the substrate.

In one embodiment, the first solder pad is disposed at one side of the substrate and the second solder pad is disposed at the other side of the substrate.

In one embodiment, the first solder pad and the second solder pad are respectively connected to the positive electrode and the negative electrode of a power source.

In one embodiment, the first solder pad and the second solder pad are respectively connected to the negative electrode and the positive electrode of a power source.

Another embodiment of the present invention provides a LED with high reliability, which includes a first solder pad, a second pad and a plurality of LED die pairs. The LED die pairs are connected to each other in series. Each of the LED die pairs has two LED dies connected to each other in parallel and each of the LED dies has a positive electrode and a negative electrode. The positive electrode and the negative electrode of one of the LED dies of one of the LED die pairs are respectively connected to the negative electrode and the positive electrode of the other of the LED dies of the LED die pair via two first conductive wires. The positive electrode of one of the LED dies of the LED die pair at the front end and the negative electrode of one of the LED dies of the LED die pair at the rear end are respectively connected to the first solder pad and the second solder pad via two second conductive wires.

In one embodiment, the LED further includes a substrate and the LED die pairs are disposed on the substrate.

In one embodiment, the first solder pad is disposed at one side of the substrate and the second solder pad is disposed at the other side of the substrate.

In one embodiment, the first solder pad and the second solder pad are respectively connected to the positive electrode and the negative electrode of a power source.

In one embodiment, the first solder pad and the second solder pad are respectively connected to the negative electrode and the positive electrode of a power source.

The LED with high reliability in accordance with the embodiments of the present invention may have the following advantages:

(1) In one embodiment of the present invention, the LED has a plurality of LED dies, and the positive electrode and the negative electrode of any one of the LED dies are respectively connected to the negative electrode and the positive electrode of the LED die adjacent thereto. Thus, the polarities of any two adjacent LED dies connected to each other in parallel are reverse to each other. Thus, when an electrostatic voltage is applied to the LED and the voltage applied to the LED die whose polarity reverse to that of the electrostatic voltage is greater than the turn-on voltage of this LED die, this LED die would be clamped at the turn-on voltage thereof. Thus, this LED die would not be damaged due to excessive voltage. In this way, the reliability of the LED can be significantly enhanced.

(2) In one embodiment of the present invention, the LED is not polarity-sensitive. That is to say, the firs solder pad of the LED can serve as the positive electrode or the negative electrode, and the second solder pad of the LED can also serve as the positive electrode or the negative electrode. Accordingly, the LED can always operate normally whether the LED is connected to the positive electrode and the negative electrode of the power source in the first direction or in the second direction.

(3) In one embodiment of the present invention, when any one of the LED dies of the LED is damaged, the LED can still operate normally after the technician changes the direction of connecting the LED to the power source from the first direction to the second direction (or from the second direction to the first direction). Therefore, the lighting device can be easier to maintain, which can completely conform to the requirements of environmental protection.

(4) In one embodiment of the present invention, the quantity of the LED dies of the LED can be increased or decreased according to actual requirements in order to adjust the characteristics of the LED. Thus, the LED can definitely meet the requirements of different applications, so the LED can be more flexible in use and more comprehensive in application.

(5) In one embodiment of the present invention, the structure of the LED is simple and easy to maintain, so the LED can achieve the desired technical effects without significantly increasing the cost thereof. Accordingly, the LED can achieve high commercial value.

These and other objectives of the present invention will no doubt become readily apparent to those of ordinary skill in the art after reading the following detailed description of the preferred embodiment that is illustrated in the various figures and drawings.

BRIEF DESCRIPTION OF THE DRAWINGS

The present invention will become more fully understood from the detailed description given herein below and the accompanying drawings which are given by way of illustration only, and thus are not limitative of the present invention and wherein:

FIG. 2 is a flow chart of a method for manufacturing the LED with high reliability in according to one embodiment of the present invention.

DETAILED DESCRIPTION

Figure 1:
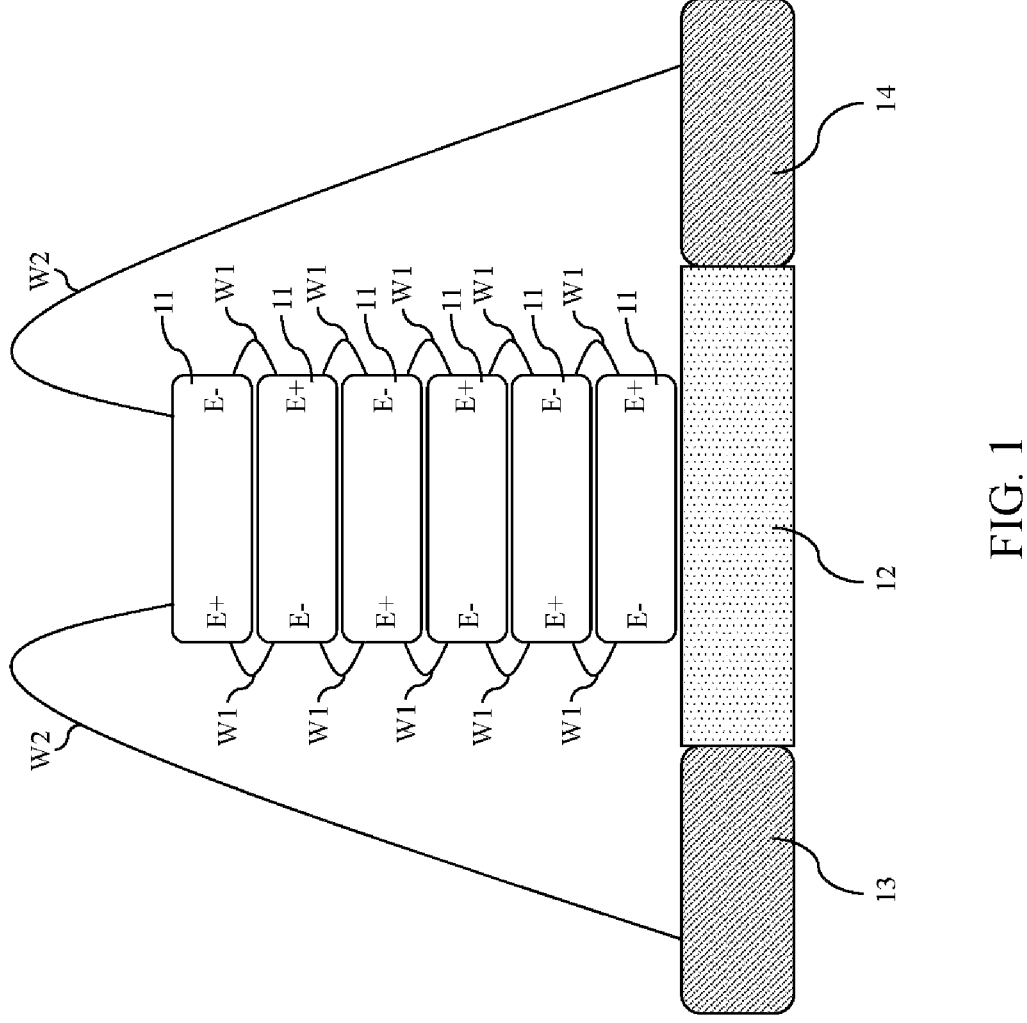
FIG. 1 is a schematic view of a structure of a LED in according to one embodiment of the present invention.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing. It should be understood that, when it is described that an element is "coupled" or "connected" to another element, the element may be "directly coupled" or "directly connected" to the other element or "coupled" or "connected" to the other element through a third element. In contrast, it should be understood that, when it is described that an element is "directly coupled" or "directly connected" to another element, there are no intervening elements.

Please refer to FIG. 1, which is a schematic view of a structure of a LED with high reliability in according to one embodiment of the present invention. As shown in FIG. 1, the LED 1 has a plurality of LED dies 11, a substrate 12, a first solder pad 13 and a second solder pad 14.

The first solder pad 13 is disposed at one side of the substrate 12 and the second solder pad 14 is disposed at the other side of the substrate 12. The first solder pad 13 and the second solder pad 14 can be connected to the positive electrode and the negative electrode of a power source (not shown in the drawings). Alternatively, the first solder pad 13 and the second solder pad 14 can be connected to the negative electrode and the positive electrode of the power source.

The above LED dies 11 are disposed on the substrate 12 and connected to each other in parallel. Each of the LED dies 11 has a positive electrode E+ and a negative electrode E−. The positive electrode E+ and the negative electrode E− of any one of the LED dies 11 are respectively connected to the negative electrode E− and the positive electrode E+ of the LED die 11 adjacent thereto via two first conductive wires W1. In this way, the two adjacent LED dies 11 can be in parallel connection on the basis that the polarities thereof are reverse to each other.

Besides, the positive electrode E+ and the negative electrode E− of one of the above LED dies 11 are respectively connected to the first solder pad 13 and the second solder pad 14 via two second conductive wires W2. In one embodiment, the material of the first conductive wire W1 and the second conductive wire W2 may be gold, alloy or other similar materials.

As set forth above, the LED 1 has a plurality of LED dies 11 and the positive electrode E+ and the negative electrode E− of any one of the above LED dies 11 are connected to the positive electrode E+ and the negative electrode E− of the LED die 11 adjacent thereto. Therefore, the polarities of any two adjacent LED dies 11 are reverse to each other. Via the above connection structure, when an electrostatic voltage is applied to the LED 1 and the voltage applied to the LED die 11 whose polarity reverse to that of the electrostatic voltage is greater than the turn-on voltage of this LED die 11, this LED die 11 would be clamped at the turn-on voltage thereof. Thus, this LED die 11 would not be damaged due to excessive voltage. Thus, the user can directly connect the LED 1 to the power source without considering whether the reverse connection occurs. That is to say, the LED 1 is not polarity-sensitive. Accordingly, the LED 1 can be more convenient in use and the reliability of the LED 1 can be significantly enhanced.

In addition, when any one of the LED dies 11 of the LED 1 is damaged and cannot operate normally, the technician can change the direction of connecting the LED 1 to the power source from the first direction to the second direction (or from the second direction to the first direction; the first direction is reverse to the second direction; for example, when the LED 1 is connected to the power source in the first direction, the first solder pad 13 and the second solder pad 14 of the LED 1 are respectively connected to the positive electrode and the negative electrode of the LED 1; when the LED 1 is connected to the power source in the second direction, the first solder pad 13 and the second solder pad 14 of the LED 1 are respectively connected to the negative electrode and the positive electrode of the LED 1). Then, the LED 1 can operate normally again. Therefore, the lighting device adopting the LED 1 can be easier to maintain and satisfy the requirements of environmental protection.

The embodiment just exemplifies the present invention and is not intended to limit the scope of the present invention; any equivalent modification and variation according to the spirit of the present invention is to be also included within the scope of the following claims and their equivalents.

Please refer to FIG. 2, which is a flow chart of a method for manufacturing the LED with high reliability in according to one embodiment of the present invention. As shown in FIG. 2, the method for manufacturing the LED with high reliability according to the embodiment includes the following steps:

Step S21: disposing a first solder pad at one side of a substrate.

Step S22: disposing a second solder pad at the other side of the substrate.

Step S23: providing a plurality of LED dies, and respectively connecting the positive electrode and the negative electrode of each LED die to the negative electrode and the positive electrode of the LED die adjacent thereto via two first conductive wires, such that the LED dies can be in parallel connection on the basis that the polarities thereof are reverse to each other.

Step S24: disposing the LED dies on the substrate.

Step S25: connecting the positive electrode and the negative electrode of one of the LED dies to the first solder pad and the second solder pad via two second conductive wires.

The embodiment just exemplifies the present invention and is not intended to limit the scope of the present invention; any equivalent modification and variation according to the spirit of the present invention is to be also included within the scope of the following claims and their equivalents.

Although the operations of the method(s) herein are shown and described in a particular order, the order of the operations of each method may be altered so that certain operations may be performed in an inverse order or so that certain operations may be performed, at least in part, concurrently with other operations. In another embodiment, instructions or sub-operations of distinct operations may be implemented in an intermittent and/or alternating manner.

It is worthy to point out that the currently available LED has several LED dies, and these LED dies are connected to each other in parallel or in series. However, if any one of the LED dies is damaged, the lighting effect of the LED obviously deteriorates. When the above situation occurs, the LED may malfunction and cannot be used again. Thus, the reliability of the currently available LEDs needs to be further enhanced. On the contrary, according to one embodiment of the present invention, the LED has a plurality of LED dies, and the positive electrode and the negative electrode of any one of the LED dies are respectively connected to the negative electrode and the positive electrode of the LED die adjacent thereto. Thus, the polarities of any two adjacent LED dies connected to each other in parallel are reverse to each other. Thus, when an electrostatic voltage is applied to the LED and the voltage applied to the LED die whose polarity reverse to that of the electrostatic voltage is greater than the turn-on voltage of this LED die, this LED die would be clamped at the turn-on voltage thereof. Thus, this LED die would not be damaged due to excessive voltage. In this way, the reliability of the LED can be significantly enhanced.

Besides, according to one embodiment of the present invention, the LED is not polarity-sensitive. That is to say, the firs solder pad of the LED can serve as the positive electrode or the negative electrode, and the second solder pad of the LED can also serve as the positive electrode or the negative electrode. Accordingly, the LED can always operate normally whether the LED is connected to the positive electrode and the negative electrode of the power source in the first direction or in the second direction.

Further, according to one embodiment of the present invention, when any one of the LED dies of the LED is damaged, the LED can still operate normally after the technician changes the direction of connecting the LED to the power source from the first direction to the second direction (or from the second direction to the first direction). Therefore, the lighting device can be easier to maintain, which can completely conform to the requirements of environmental protection.

Moreover, according to one embodiment of the present invention, the quantity of the LED dies of the LED can be increased or decreased according to actual requirements in order to adjust the characteristics of the LED. Thus, the LED can definitely meet the requirements of different applications, so the LED can be more flexible in use and more comprehensive in application.

Furthermore, according to one embodiment of the present invention, the structure of the LED is simple and easy to maintain, so the LED can achieve the desired technical effects without significantly increasing the cost thereof. Accordingly, the LED can achieve high commercial value. As described above, the LED according to the embodiments of the present invention can definitely achieve great technical effects.

Figure 3:
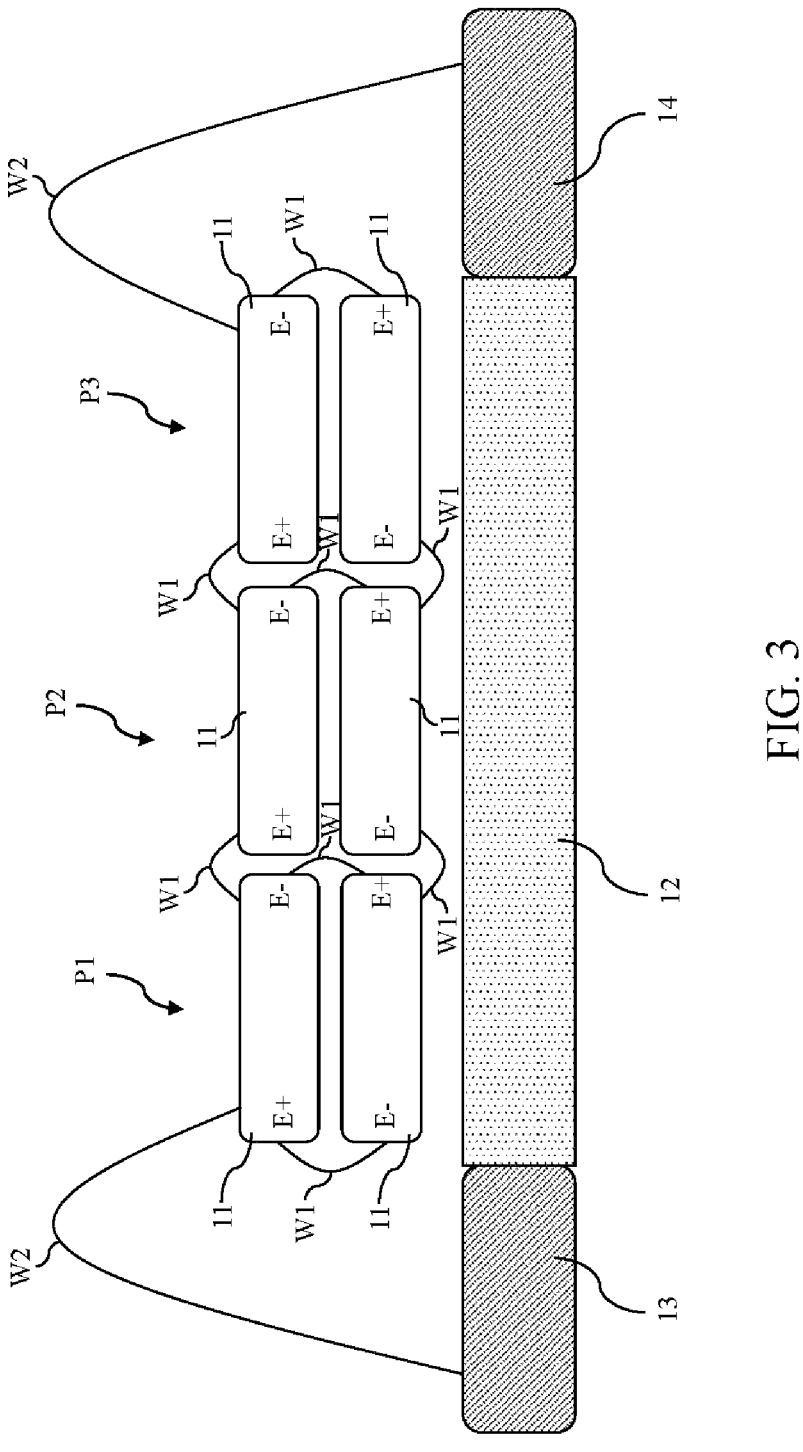
FIG. 3 is a schematic view of a structure of a LED in according to another embodiment of the present invention.

Please refer to FIG. 3, which is a schematic view of a structure of a with high reliability in according to another embodiment of the present invention. As shown in FIG. 3, the LED 1 has a plurality of LED die pairs P1~P3, a substrate 12, a first solder pad 13 and a second solder pad 14.

The first solder pad 13 is disposed at one side of the substrate 12 and the second solder pad 14 is disposed at the other side of the substrate 12. The first solder pad 13 and the second solder pad 14 can be connected to the positive electrode and the negative electrode of a power source (not shown in the drawings). Alternatively, the first solder pad 13 and the second solder pad 14 can be connected to the negative electrode and the positive electrode of the power source.

The above LED die pairs P1~P3 are disposed on the substrate 12 and connected to each other in series. Each of the LED die pairs P1~P3 has two LED dies 11. For instance, the LED die pair P1 has two LED dies 11 connected in parallel. The positive electrode E+ and the negative electrode E− of one of the LED dies 11 are respectively connected to the negative electrode E− and the positive electrode E+ of the other of the LED dies 11 via two first connective wire W1. In this way, the two LED dies 11 of the LED die pair P1 can be in parallel connection on the basis that the polarities thereof are reverse to each other. The LED die pairs P2~P3 can have the same structure.

FIG. 3 clearly shows that the negative electrode E− of the LED die 11 on the upper layer of the LED die pair P1 is connected to the positive electrode E+ of the LED die 11 on the upper layer of the LED die pair P2 via the first conductive wire W1. The positive electrode E+ of the LED die 11 on the lower layer of the LED die pair P1 is connected to the negative electrode E− of the LED die 11 on the lower layer of the LED die pair P2 via the first conductive wire W1. Thus, the LED die pair P1 can be connected to the LED die pair P2 in series. Similarly, the negative electrode E− of the LED die 11 on the upper layer of the LED die pair P2 is connected to the positive electrode E+ of the LED die 11 on the upper layer of the LED die pair P3 via the first conductive wire W1. The positive electrode E+ of the LED die 11 on the lower layer of the LED die pair P2 is connected to the negative electrode E− of the LED die 11 on the lower layer of the LED die pair P3 via the first conductive wire W1. Thus, the LED die pair P2 can be connected to the LED die pair P3 in series. In this way, the LED die pairs P1~P3 can be in series connection.

Besides, the positive electrode E+ of one (on the upper layer) of the LED dies 11 of the LED die pair P1 at the front end and the negative electrode E− of one (on the upper layer) of the LED dies 11 of the LED die pair P3 at the rear end are respectively connected to the first solder pad 13 and the second solder pad 14 via two second conductive wires W2. In one embodiment, the material of the first conductive wire W1 and the second conductive wire W2 may be gold, alloy or other similar materials.

As previously stated, the LED 1 has a plurality of LED die pairs P1~P3 and any one of the LED die pairs P1~P3 has two LED dies 11 connected in parallel. In addition, the positive electrode E+ and the negative electrode E– of one of the LED dies 11 are respectively connected to the negative electrode E– and the positive electrode E+ of the other of the LED dies 11. Therefore, the two LED dies 11 of any one of the LED die pairs P1~P3 can be in parallel connection on the basis that the polarities thereof are reverse to each other. Via the above connection structure, when an electrostatic voltage is applied to the LED 1 and the voltage applied to the LED die 11 whose polarity reverse to that of the electrostatic voltage is greater than the turn-on voltage of this LED die 11, this LED die 11 would be clamped at the turn-on voltage thereof. Thus, this LED die 11 would not be damaged due to excessive voltage. Thus, the user can directly connect the LED 1 to the power source without considering whether the reverse connection occurs. That is to say, the LED 1 is not polarity-sensitive. Accordingly, the LED 1 can be more convenient in use and the reliability of the LED 1 can be significantly enhanced.

Similarly, when any one of the LED dies 11 of the LED 1 is damaged and cannot operate normally, the technician can change the direction of connecting the LED 1 to the power source from the first direction to the second direction (or from the second direction to the first direction; the first direction is reverse to the second direction). Then, the LED 1 can operate normally again. Therefore, the lighting device adopting the LED 1 can be easier to maintain and satisfy the requirements of environmental protection.

The embodiment just exemplifies the present invention and is not intended to limit the scope of the present invention; any equivalent modification and variation according to the spirit of the present invention is to be also included within the scope of the following claims and their equivalents.

Figure 4:
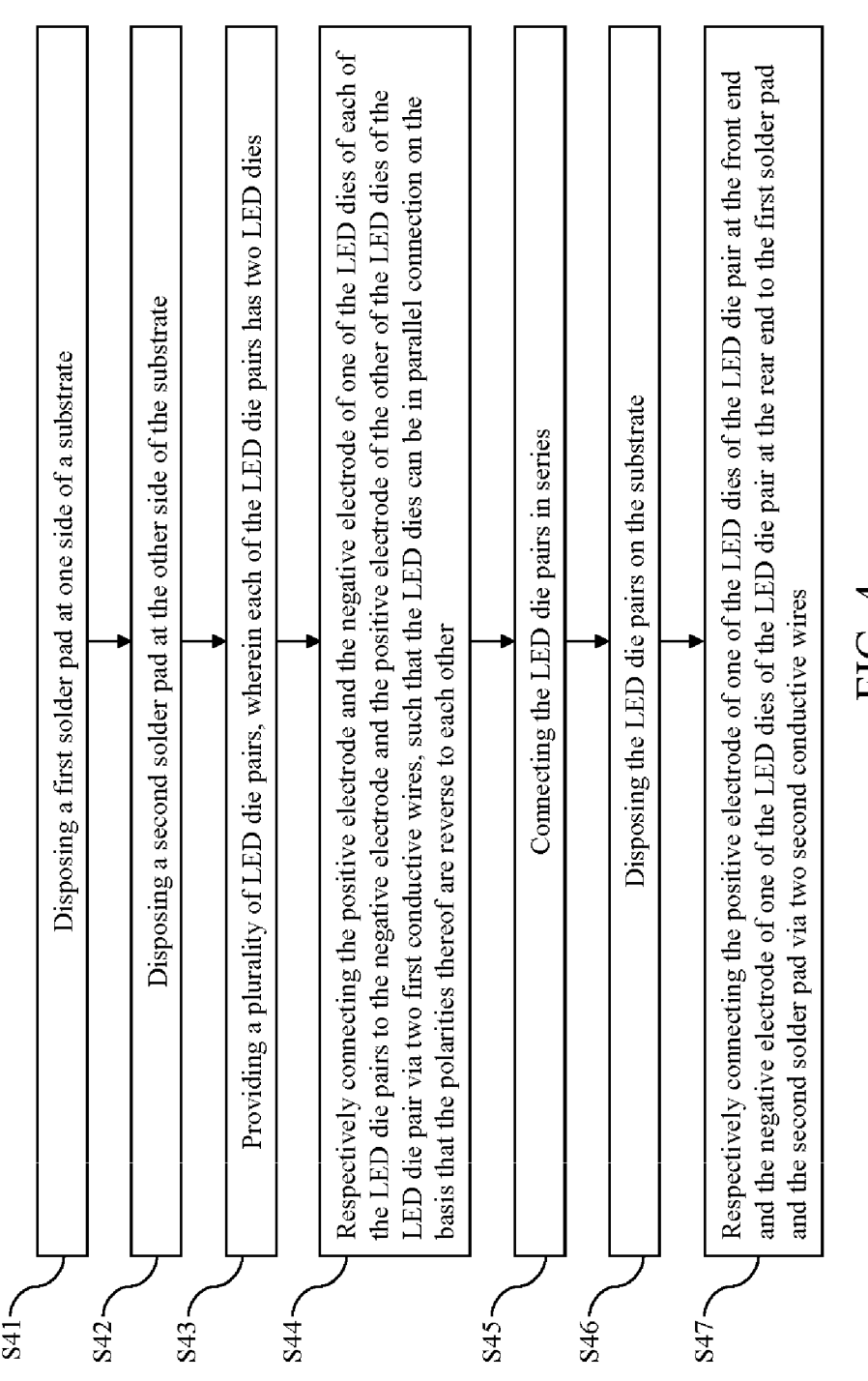
FIG. 4 is a flow chart of a method for manufacturing the LED with high reliability in according to another embodiment of the present invention.

Please refer to FIG. 4, which is a flow chart of a method for manufacturing the LED with high reliability in according to another embodiment of the present invention. As shown in FIG. 4, the method for manufacturing the LED with high reliability according to the embodiment includes the following steps:

Step S41: disposing a first solder pad at one side of a substrate.

Step S42: disposing a second solder pad at the other side of the substrate.

Step S43: providing a plurality of LED die pairs, wherein each of the LED die pairs has two LED dies.

Step S44: respectively connecting the positive electrode and the negative electrode of one of the LED dies of each of the LED die pairs to the negative electrode and the positive electrode of the other of the LED dies of the LED die pair via two first conductive wires, such that the LED dies can be in parallel connection on the basis that the polarities thereof are reverse to each other.

Step S45: connecting the LED die pairs in series.

Step S46: disposing the LED die pairs on the substrate.

Step S47: respectively connecting the positive electrode of one of the LED dies of the LED die pair at the front end and the negative electrode of one of the LED dies of the LED die pair at the rear end to the first solder pad and the second solder pad via two second conductive wires.

The embodiment just exemplifies the present invention and is not intended to limit the scope of the present invention; any equivalent modification and variation according to the spirit of the present invention is to be also included within the scope of the following claims and their equivalents.

Although the operations of the method(s) herein are shown and described in a particular order, the order of the operations of each method may be altered so that certain operations may be performed in an inverse order or so that certain operations may be performed, at least in part, concurrently with other operations. In another embodiment, instructions or sub-operations of distinct operations may be implemented in an intermittent and/or alternating manner.

To sum up, according to one embodiment of the present invention, the LED has a plurality of LED dies, and the positive electrode and the negative electrode of any one of the LED dies are respectively connected to the negative electrode and the positive electrode of the LED die adjacent thereto. Thus, the polarities of any two adjacent LED dies connected to each other in parallel are reverse to each other. Thus, when an electrostatic voltage is applied to the LED and the voltage applied to the LED die whose polarity reverse to that of the electrostatic voltage is greater than the turn-on voltage of this LED die, this LED die would be clamped at the turn-on voltage thereof. Thus, this LED die would not be damaged due to excessive voltage. In this way, the reliability of the LED can be significantly enhanced.

Besides, according to one embodiment of the present invention, the LED is not polarity-sensitive. That is to say, the firs solder pad of the LED can serve as the positive electrode or the negative electrode, and the second solder pad of the LED can also serve as the positive electrode or the negative electrode. Accordingly, the LED can always operate normally whether the LED is connected to the positive electrode and the negative electrode of the power source in the first direction or in the second direction.

Further, according to one embodiment of the present invention, when any one of the LED dies of the LED is damaged, the LED can still operate normally after the technician changes the direction of connecting the LED to the power source from the first direction to the second direction (or from the second direction to the first direction). Therefore, the lighting device can be easier to maintain, which can completely conform to the requirements of environmental protection.

Moreover, according to one embodiment of the present invention, the quantity of the LED dies of the LED can be increased or decreased according to actual requirements in order to adjust the characteristics of the LED. Thus, the LED can definitely meet the requirements of different applications, so the LED can be more flexible in use and more comprehensive in application.

Furthermore, according to one embodiment of the present invention, the structure of the LED is simple and easy to maintain, so the LED can achieve the desired technical effects without significantly increasing the cost thereof. Accordingly, the LED can achieve high commercial value.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. An environmentally-friendly light-emitting diode (LED), comprising:
   a first solder pad;
   a second solder pad; and a plurality of LED dies connected to each other in parallel, wherein each of the LED dies has a positive electrode and a negative electrode;

wherein the positive electrode and the negative electrode of any one of the LED dies are respectively directly connected to the negative electrode and the positive electrode of the LED die adjacent thereto via two first conductive wires, and the positive electrode and the negative electrode of one of the LED dies are respectively directly connected to the first solder pad and the second solder pad via two second conductive wires, whereby any two of the LED dies adjacent thereto are in parallel connection, and polarities thereof are reverse to each other.

2. The environmentally-friendly LED as claimed in claim 1, further comprising a substrate, wherein the LED dies are disposed on the substrate.

3. The environmentally-friendly LED as claimed in claim 2, wherein the first solder pad is disposed at one side of the substrate and the second solder pad is disposed at the other side of the substrate.

4. The environmentally-friendly LED as claimed in claim 1, wherein the first solder pad and the second solder pad are respectively connected to a positive electrode and a negative electrode of a power source.

5. The environmentally-friendly LED as claimed in claim 1, wherein the first solder pad and the second solder pad are respectively connected to a negative electrode and a positive electrode of a power source.

6. An environmentally-friendly LED, comprising:

a first solder pad;

a second solder pad; and a plurality of LED die pairs connected to each other in series, wherein each of the LED die pairs has two LED dies connected to each other in parallel and each of the LED dies has a positive electrode and a negative electrode, wherein the positive electrode and the negative electrode of one of the LED dies of one of the LED die pairs are respectively directly connected to the negative electrode and the positive electrode of the other of the LED dies of the LED die pair via two first conductive wires, whereby the LED dies are in parallel connection, and polarities thereof are reverse to each other;

wherein the positive electrode of one of the LED dies of the LED die pair at a front end and the negative electrode of one of the LED dies of the LED die pair at a rear end are respectively directly connected to the first solder pad and the second solder pad via two second conductive wires.

7. The environmentally-friendly LED as claimed in claim 6, further comprising a substrate, wherein the LED die pairs are disposed on the substrate.

8. The environmentally-friendly LED as claimed in claim 7, wherein the first solder pad is disposed at one side of the substrate and the second solder pad is disposed at the other side of the substrate.

9. The environmentally-friendly LED as claimed in claim 6, wherein the first solder pad and the second solder pad are respectively connected to a positive electrode and a negative electrode of a power source.

10. The environmentally-friendly LED as claimed in claim 6, wherein the first solder pad and the second solder pad are respectively connected to a negative electrode and a positive electrode of a power source.

* * * * *